United States Patent
Ouchi et al.

(10) Patent No.: US 8,077,391 B2
(45) Date of Patent: Dec. 13, 2011

(54) WAVEFRONT ABERRATION MEASURING METHOD, MASK, WAVEFRONT ABERRATION MEASURING DEVICE, EXPOSURE APPARATUS, AND DEVICE MANUFACTURING METHOD

(75) Inventors: Chidane Ouchi, Utsunomiya (JP);
Masanobu Hasegawa, Utsunomiya (JP);
Seima Kato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 123 days.

(21) Appl. No.: 12/391,918

(22) Filed: Feb. 24, 2009

(65) Prior Publication Data
US 2009/0213389 A1      Aug. 27, 2009

(30) Foreign Application Priority Data
Feb. 25, 2008   (JP) ................................. 2008-043064

(51) Int. Cl.
*G02B 5/18*      (2006.01)
*G01B 9/02*      (2006.01)
(52) U.S. Cl. ....................................... 359/569; 356/499
(58) Field of Classification Search .................. 356/401, 356/499, 616, 511–515; 359/569
See application file for complete search history.

(56) References Cited

U.S. PATENT DOCUMENTS

| 7,081,962 B2 * | 7/2006 | Nakauchi | 356/521 |
| 2004/0070740 A1 * | 4/2004 | Irie | 355/52 |

FOREIGN PATENT DOCUMENTS

| JP | 2006-332586 A | 12/2006 |
| WO | 2006/115292 A1 | 11/2006 |

* cited by examiner

*Primary Examiner* — Hwa Lee

(57) ABSTRACT

A wavefront aberration measuring device includes a mask placed in an object plane of a to-be-tested optical system and having a pattern including a pinhole producing a spherical wave and adjoining diffraction gratings each ruled with lines oriented in a direction different from the other; an illumination optical system that illuminates an area of the mask with light emitted from a light source; a light splitter that splits the light from the pattern transmitted through the to-be-tested optical system; an image pickup unit that takes an image of interference fringes produced by the split light, the image being used in measuring wavefront aberration of the to-be-tested optical system; a detector that detects respective light quantities of respective diffracted beams from the respective illuminated diffraction gratings; and a control unit that controls alignment of the illuminated area of the mask and the pattern in accordance with a detection result.

3 Claims, 7 Drawing Sheets

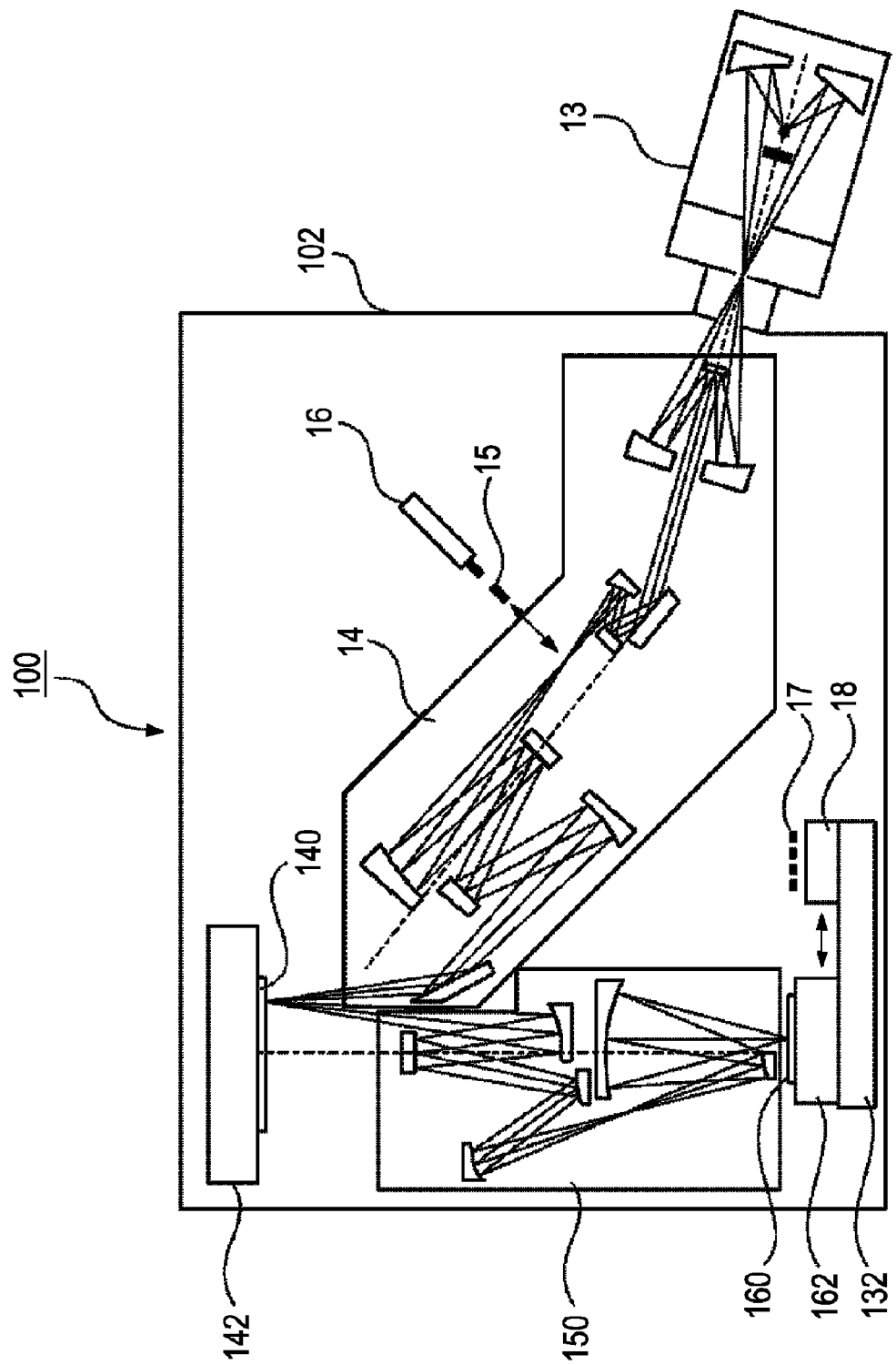

US 8,077,391 B2

WAVEFRONT ABERRATION MEASURING METHOD, MASK, WAVEFRONT ABERRATION MEASURING DEVICE, EXPOSURE APPARATUS, AND DEVICE MANUFACTURING METHOD

BACKGROUND OF THE INVENTION

Field of the Invention

The present invention generally relates to wavefront aberration measuring methods, masks, wavefront aberration measuring devices, exposure apparatuses, and device manufacturing methods.

Description of the Related Art

To photolithographically manufacture semiconductor devices and the like, projection exposure apparatuses have been used in which an image of a pattern formed on a reticle is transferred to a substrate by exposure through a projection optical system. In recent years, as circuit patterns of semiconductor devices have become finer, commercialization of exposure apparatuses employing extreme ultraviolet (EUV) light having a wavelength of about 5 to 20 nm, which is shorter than the wavelength of ultraviolet light, has been under consideration.

To accurately transfer the pattern on the reticle to a substrate, the projection optical system is required to have high imaging performance with less aberration. As circuit patterns have become finer, the transfer performance of the projection optical system has become more sensitive to aberration. Therefore, it is important to accurately measure the wavefront aberration occurring in the projection optical system. Known devices that measure the wavefront aberration of the projection optical system include a point diffraction interferometer (PDI) and a lateral shearing interferometer (LSI). In the PDI and the LSI, a spherical wave resulting from diffraction by a single pinhole provided in an object plane of an optical system that is to be tested (hereinafter referred to as a to-be-tested optical system) is caused to enter and pass through the to-be-tested optical system, and the wavefront that is distorted when passing therethrough because of the aberration occurring therein is measured with a sensor.

In more recent examples, a wavefront aberration measuring device is included in an exposure apparatus. In such a case, after the exposure apparatus is operated for a certain period, the wavefront aberration of the projection optical system thereof can be measured at any time.

In a general wavefront aberration measuring device, to pick up light having a sufficient intensity through a pinhole, the pinhole needs to be illuminated at a high illuminance. To realize this, an undulator light source, which is a light source having a high brightness, fitted in an electron storage ring is used in some cases. The undulator light source, however, is of very large size and costs a fortune, and therefore is not suitable for application to wavefront aberration measuring devices to be included in exposure apparatuses.

In the case where a wavefront aberration measuring device is included in an exposure apparatus, an exposure light source, such as a laser-produced-plasma (LPP) light source or a discharge-produced-plasma (DPP) light source, typically serves as the light source of the wavefront aberration measuring device. Such a light source has low brightness, and therefore the light emitted therefrom cannot be collected to the pinhole at high illuminance. Accordingly, the quantity of light that transmits through the pinhole is small, leading to a possibility of not being able to obtain, in an observation plane, an interference image with an intensity required for wavefront measurement.

To obtain an interference image with an intensity of a required level, a wavefront aberration measuring device in which a plurality of pinholes are provided in a certain arrangement in an object plane is disclosed in Japanese Patent Laid-Open No. 2006-332586 and International Application Published Under The Patent Cooperation Treaty (PCT) bearing International Publication No. WO 2006/115292 A1. In such a configuration, since light emitted through more than one pinhole can be utilized, the utilization efficiency of light emitted from the light source can be improved, enabling measurement of the wavefront of a projection optical system even with a light source having low brightness.

To accurately measure the wavefront aberration at every measurement position with a wavefront aberration measuring device, the size of a wavefront measurement pattern (constituted by a single pinhole or a plurality of pinholes) needs to be made smaller than an area within which the aberration can be regarded as uniform. For example, in an EUV exposure apparatus, the size of the aforementioned area ranges from about 0.2 mm to 0.5 mm. If the size of a spot to be illuminated, i.e., an illumination spot, is larger than the size of the wavefront measurement pattern, the light applied to a region outside the pattern produces unnecessary noise. Such noise deteriorates the contrast of interference fringes used in interference measurement. In contrast, if the size of the illumination spot is smaller than the size of the wavefront measurement pattern, diffraction light having an intensity of a level required for wavefront measurement cannot be obtained. Therefore, the illumination spot needs to be of a size approximately equal to the size of the wavefront measurement pattern.

In addition, to obtain interference fringes having a sufficient light intensity and contrast and thus measure the wavefront aberration with high accuracy, the illumination spot and the wavefront measurement pattern need to be aligned accurately, particularly in the case where the illumination spot and the wavefront measurement pattern are of approximately the same size.

SUMMARY OF THE INVENTION

The present invention provides a mask and a wavefront aberration measurement method and device enabling highly accurate measurement of the wavefront aberration occurring in a to-be-tested optical system.

According to a first aspect of the present invention, a method of measuring wavefront aberration of a to-be-tested optical system includes applying light to an area of a mask having a pattern including a pinhole producing a spherical wave and a plurality of diffraction gratings adjoining each other, each of the diffraction gratings being ruled with lines oriented in a direction different from those of the other diffraction gratings, the mask being placed in an object plane of the to-be-tested optical system, the area of the mask to which the light is applied covering respective parts of the diffraction gratings; detecting relative positions of the area of the mask to which the light is applied and the pattern by detecting respective light quantities of respective diffracted beams of the light from respective ones of the diffraction gratings; performing alignment of the area of the mask to which the light is applied and the pattern in accordance with the detected relative positions thereof; and measuring wavefront aberration of the to-be-tested optical system by applying the light to the pattern after the alignment, the wavefront aberration being measured on the basis of interference fringes produced by the light emitted from the pattern and transmitted through the to-be-tested optical system.

According to a second aspect of the present invention, a mask used in a wavefront aberration measuring device in which wavefront aberration of a to-be-tested optical system is measured based on interference fringes produced by applying light from a light source to an area of the mask so as to cause the light emitted from the mask to be split after being transmitted through the to-be-tested optical system is provided. The mask includes a pattern including a pinhole producing a spherical wave, and a plurality of diffraction gratings adjoining each other and each ruled with lines oriented in a direction different from those of the other diffraction gratings. The mask is placed in an object plane of the to-be-tested optical system.

According to a third aspect of the present invention, a wavefront aberration measuring device includes a mask placed in an object plane of a to-be-tested optical system, the mask having a pattern including a pinhole producing a spherical wave and a plurality of diffraction gratings adjoining each other and each ruled with lines oriented in a direction different from those of the other diffraction gratings; an illumination optical system configured to illuminate an area of the mask with light emitted from a light source; a light splitter configured to split the light emitted from the pattern and transmitted through the to-be-tested optical system; an image pickup unit configured to take an image of interference fringes produced by the light split by the light splitter, the image of interference fringes being used in measuring wavefront aberration of the to-be-tested optical system; a detector configured to detect respective light quantities of respective diffracted beams of the light from respective ones of the diffraction gratings illuminated with the light; and a control unit configured to control alignment of the area of the mask illuminated with the light and the pattern in accordance with a result of detection performed by the detector.

Other features and advantages of the present invention will be apparent from the following description taken in conjunction with the accompanying drawings, in which like reference characters designate the same or alternatively similar parts throughout the figures thereof.

BRIEF DESCRIPTION OF THE DRAWINGS

The accompanying drawings, which are incorporated in and constitute a part of the specification, illustrate embodiments of the present invention and, together with the description, serve to explain the principles of the present invention.

FIG. 10 shows an EUV projection exposure apparatus.

DESCRIPTION OF THE EMBODIMENTS

Various embodiments of the present invention will now be described in detail with reference to the accompanying drawings.

Figure 1:
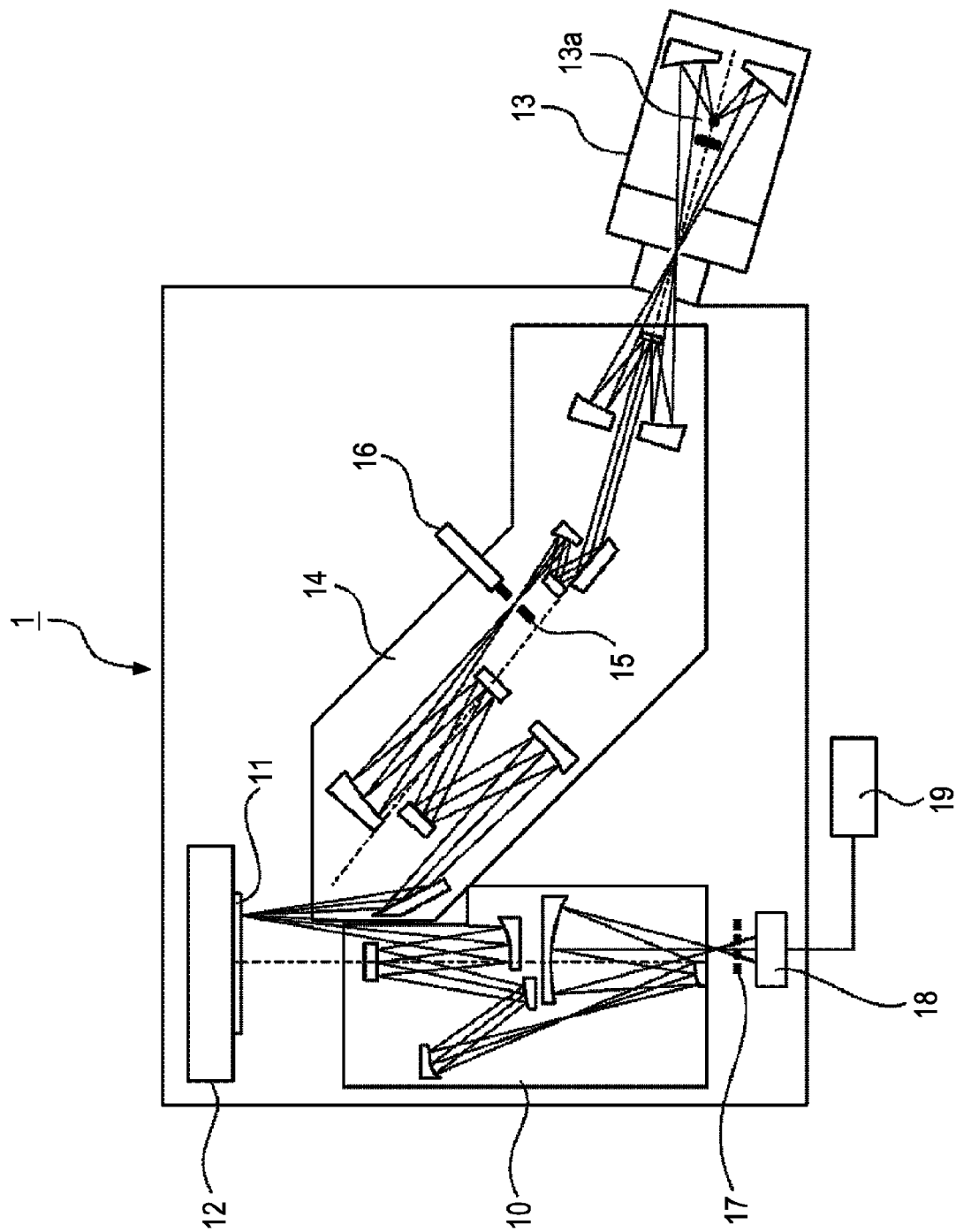
FIG. 1 shows the configuration of a wavefront aberration measuring device.

Referring to FIG. 1, a wavefront aberration measuring device 1 according to a first embodiment of the present invention will now be described. The wavefront aberration measuring device 1 measures the wavefront (wavefront aberration) of a projection optical system, as a to-be-tested optical system 10, included in an EUV exposure apparatus. The wavefront aberration measuring device 1 includes a wavefront measurement mask 11, a stage 12, an EUV light source 13, an illumination optical system 14, an aperture stop 15, an aperture-stop-moving mechanism 16, a diffraction grating 17, an image pickup unit 18, and a control unit 19.

The wavefront measurement mask 11 is mounted on the stage 12 in such a manner as to be placed in an object plane of the to-be-tested optical system 10. With the movement of the stage 12, the wavefront measurement mask 11 moves two-dimensionally within the object plane of the to-be-tested optical system 10. The EUV light source 13 emits EUV light from an emission point 13a. The EUV light is imaged at the aperture stop (field stop) 15 provided in the illumination optical system 14. The light that has passed through the aperture stop 15 is projected onto the wavefront measurement mask 11. Thus, illuminating light in the form of a spot, i.e., an illumination spot, is obtained on the wavefront measurement mask 11. The aperture stop 15 is moved by the aperture-stop-moving mechanism 16 within a plane perpendicular to the optical axis of the illuminating light, whereby the illumination spot obtained as described above is moved to a predetermined measurement position in the object plane of the to-be-tested optical system 10.

The wavefront measurement mask 11 has a wavefront measurement pattern, which will be described separately below. When the illuminating light is applied to the wavefront measurement pattern, many spherical waves are produced. The spherical waves produced in such a manner undergo a distortion when passing through the to-be-tested optical system 10, the distortion being equal to a distortion produced by the wavefront aberration of the to-be-tested optical system 10. Subsequently, the distorted spherical waves are split by the diffraction grating 17, as a light splitter, into diffracted beams having a number of orders. The diffracted beams interfere with each other, thereby forming interference fringes. The image of the interference fringes are taken by the image pickup unit 18. The interference fringes contain information on the aberration of the to-be-tested optical system 10. Data on the interference fringes taken as an image is acquired by the control unit 19. The control unit 19 analyzes (performs arithmetic processing to) the data. Thus, the wavefront aberration of the to-be-tested optical system 10 can be determined.

Figure 2:
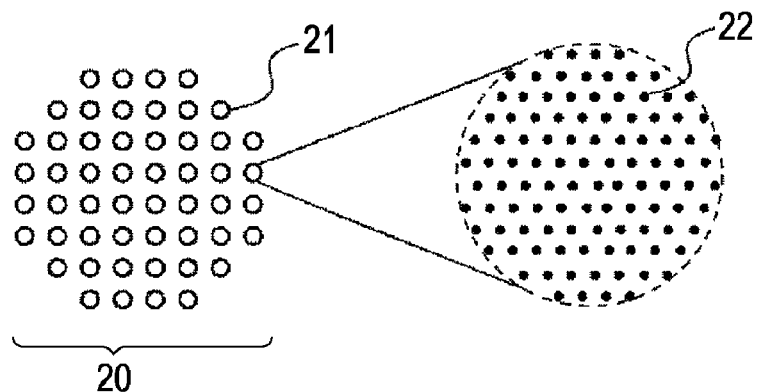
FIG. 2 shows a wavefront measurement pattern.

The wavefront measurement pattern will now be described with reference to FIG. 2. A wavefront measurement pattern 20 includes a plurality of pinholes 21 that are arranged regularly. The pinholes 21 each include a number of reflective pinholes 22. The pinholes 22 reflect light and each have such a diameter that light diffracted by the pinhole 22 is of a size that can be regarded as a spherical wave. Accordingly, the wavefront measurement pattern 20 produces a number of spherical waves. The principles and methods of measuring the wavefront aberration by using a pattern such as the wavefront measurement pattern 20 are described in detail in Japanese Patent Laid-Open No. 2006-332586 and International Application Published Under The Patent Cooperation Treaty (PCT) bearing International Publication No. WO 2006/115292 A1, each of which is hereby incorporated by reference herein in its entirety.

Figures 3A, 3B:
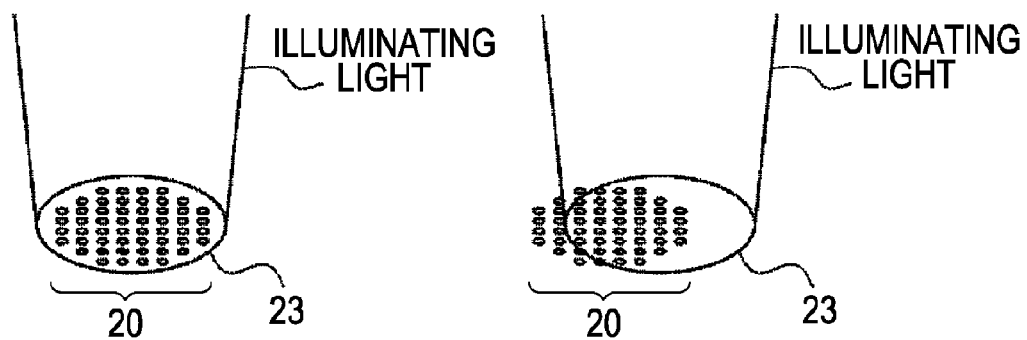
FIGS. 3A and 3B each show a positional relationship between the wavefront measurement pattern and an illumination spot.

Light reflected by regions other than the pinholes produces noise and has adverse influence on the accuracy in wavefront measurement. To minimize such reflection, regions of the wavefront measurement pattern 20 other than the pinholes are covered with an anti-reflection material. FIGS. 3A and 3B each show the positional relationship between the wavefront measurement pattern 20 and an illumination spot 23 having a circular shape. FIG. 3A shows a case where the position of the illumination spot 23 and the position of the wavefront measurement pattern 20 match, whereby the entirety of the wavefront measurement pattern 20 is illuminated by the illumination spot 23. FIG. 3B shows a case where the position of the illumination spot 23 and the position of the wavefront measurement pattern 20 do not match, resulting in failure of the illumination spot 23 to illuminate the entirety of the wavefront measurement pattern 20. The illumination spot 23 is a region of the wavefront measurement mask 11 illuminated by the illumination optical system 14. The illumination spot 23 has a predetermined spot diameter. In the first embodiment, the spot diameter of the illumination spot 23 is approximately the same as the diameter of the wavefront measurement pattern 20.

In the case shown in FIG. 3B, the quantity of light applied to the wavefront measurement pattern 20 (the pinholes) is relatively small, whereas the quantity of light applied to the anti-reflection material provided around the pinholes is relatively large. Even the anti-reflection material has a reflectance of more than zero and does reflect a small quantity of light. For example, TaBN, which is employed as the anti-reflection material, has a reflectance of about 0.3%. Such reflection reduces the intensity of the image of the interference fringes taken by the image pickup unit 18, and also deteriorates the contrast thereof. Consequently, the accuracy in wavefront measurement is deteriorated. In this respect, to realize highly accurate wavefront measurement, the position of the illumination spot 23 and the position of the wavefront measurement pattern 20 need to match, as shown in FIG. 3A.

Figure 4:
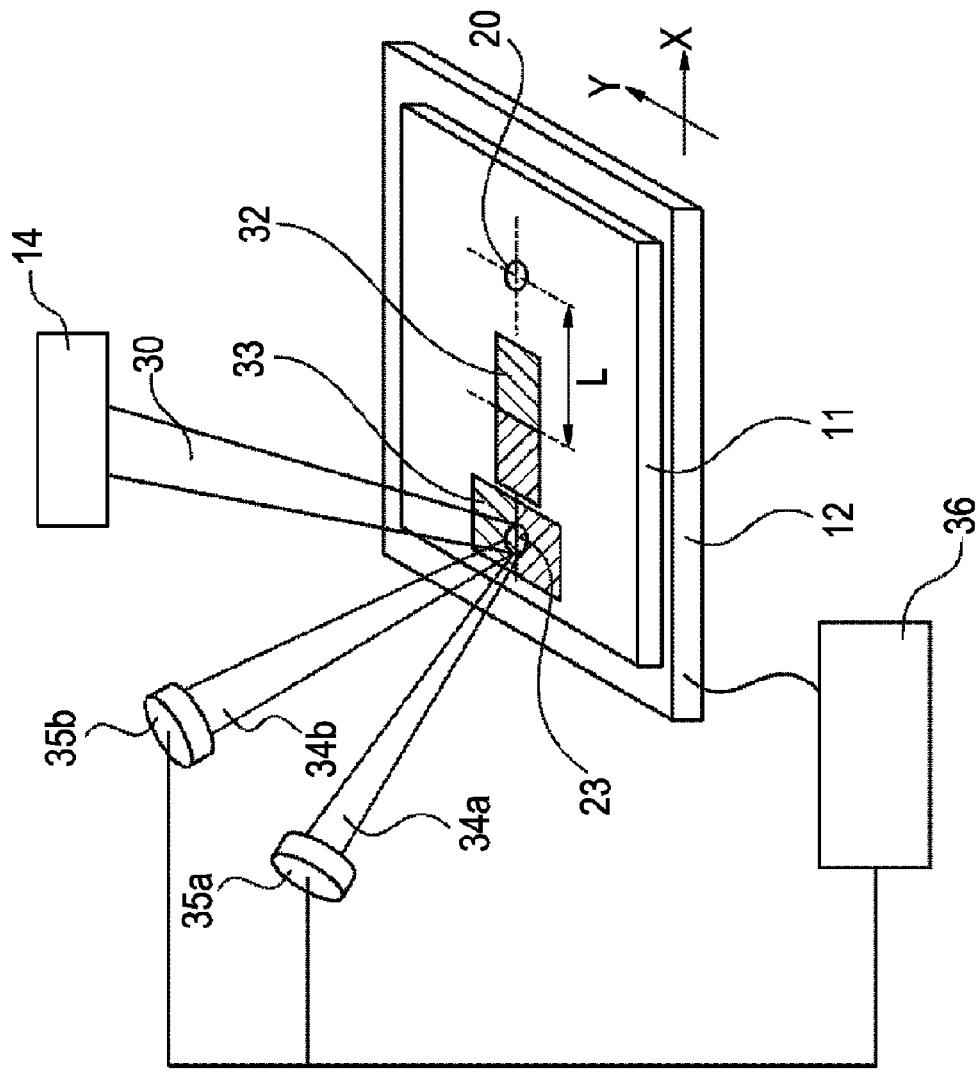
FIG. 4 shows a wavefront measurement mask and elements provided therearound in a first embodiment of the present invention.
Figure 5:
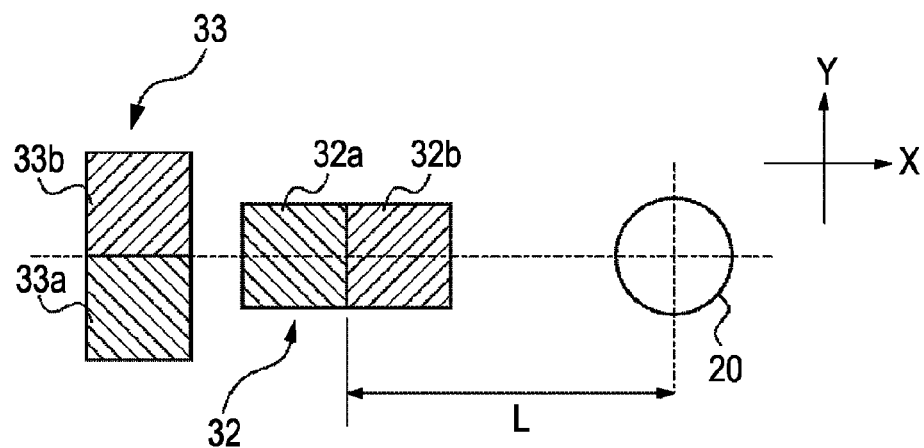
FIG. 5 shows alignment marks and the wavefront measurement pattern in the first embodiment.

Referring to FIGS. 4 and 5, an alignment mechanism that matches the position of the wavefront measurement pattern 20 with the position of the illumination spot 23 in the first embodiment will now be described. FIG. 4 shows the wavefront measurement mask 11 shown in FIG. 1 and elements provided therearound. Illuminating light 30 emitted from the illumination optical system 14 illuminates the surface of the wavefront measurement mask 11, thereby defining the illumination spot 23. The wavefront measurement mask 11 has not only the wavefront measurement pattern 20 but also an X-direction alignment mark 32 and a Y-direction alignment mark 33 formed thereon. The illuminating light 30 is configured to illuminate the X-direction alignment mark 32, the Y-direction alignment mark 33, or the wavefront measurement pattern 20.

The X- and Y-direction alignment marks 32 and 33 include diffraction gratings. The diffraction gratings are ruled with lines as shown in oblique lines in FIG. 5. The X-direction alignment mark 32 includes two diffraction gratings 32a and 32b adjoining in the X direction. The orientations of the lines of the diffraction gratings 32a and 32b are different from each other. The lines of the diffraction grating 32a extend from upper left to lower right. The lines of the diffraction grating 32b extend from upper right to lower left. The Y-direction alignment mark 33 also includes two diffraction gratings 33a and 33b adjoining in the Y direction, and the orientations of the lines thereof are different from each other. The lines of the diffraction grating 33a extend from upper left to lower right. The lines of the diffraction grating 33b extend from upper right to lower left.

The Y-coordinate of the boundary between the two diffraction gratings 33a and 33b of the Y-direction alignment mark 33 coincides with the Y-coordinate of the center of the wavefront measurement pattern 20. The X-direction alignment mark 32 is set in such a manner that the boundary between the two diffraction gratings 32a and 32b thereof lies at a predetermined distance L from the X-coordinate of the center of the wavefront measurement pattern 20.

The illuminating light 30 applied to the X-direction alignment mark 32 or the Y-direction alignment mark 33 is split by the corresponding diffraction gratings into a number of diffracted beams. The light quantity of a diffracted beam of a predetermined order is detected by a photodetector. For example, a case where the Y-direction alignment mark 33 is illuminated will now be described. There are various diffracted beams from the two diffraction gratings 33a and 33b. The light quantity of a first-order diffraction beam 34a from the diffraction grating 33a is detected by a photodetector 35a, and the light quantity of a first-order diffracted beam 34b from the diffraction grating 33b is detected by a photodetector 35b. The diffracted beam to be detected may be of another order.

Figure 6:
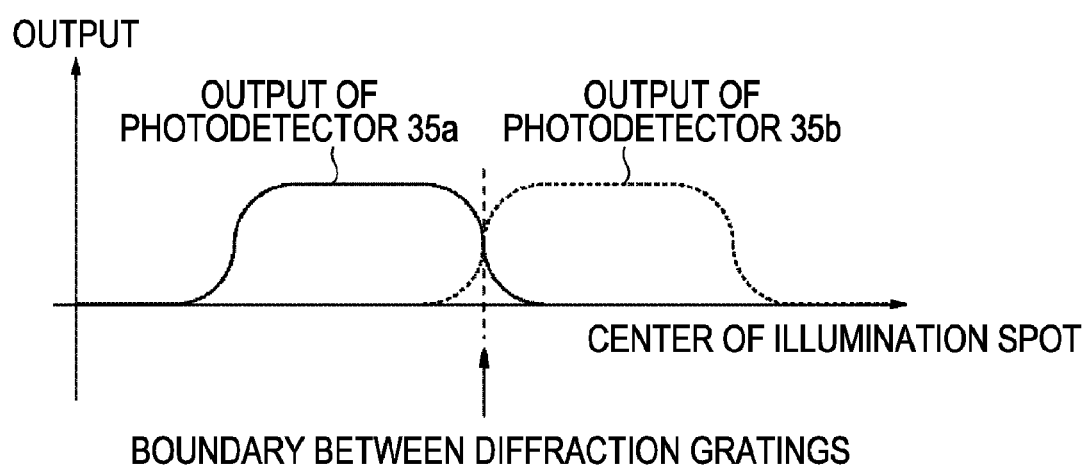
FIG. 6 shows the relationship between the position of the illumination spot and the outputs of photodetectors.

FIG. 6 shows the relationship between the center position of the illumination spot 23 applied to the X- or Y-direction alignment mark 32 or 33 and the output (the quantity of detected light) of the photodetectors 35a and 35b. When the center of the illumination spot 23 is positioned at the boundary between the two gratings, that is, when the illumination spot 23 covers equal areas of the respective diffraction gratings, the outputs of the photodetectors 35a and 35b are equal. Therefore, if the wavefront measurement mask 11 is moved in such a manner that the outputs of the photodetectors 35a and 35b become equal, the relative positions of the center of the illumination spot 23 and the boundary between the two diffraction gratings constituting the alignment mark can be detected accurately. Since the relative positions of the alignment mark and the wavefront measurement pattern 20 are known in advance, the relative positions of the center of the wavefront measurement pattern 20 and the center of the illumination spot 23 can be detected accurately.

Figure 7:
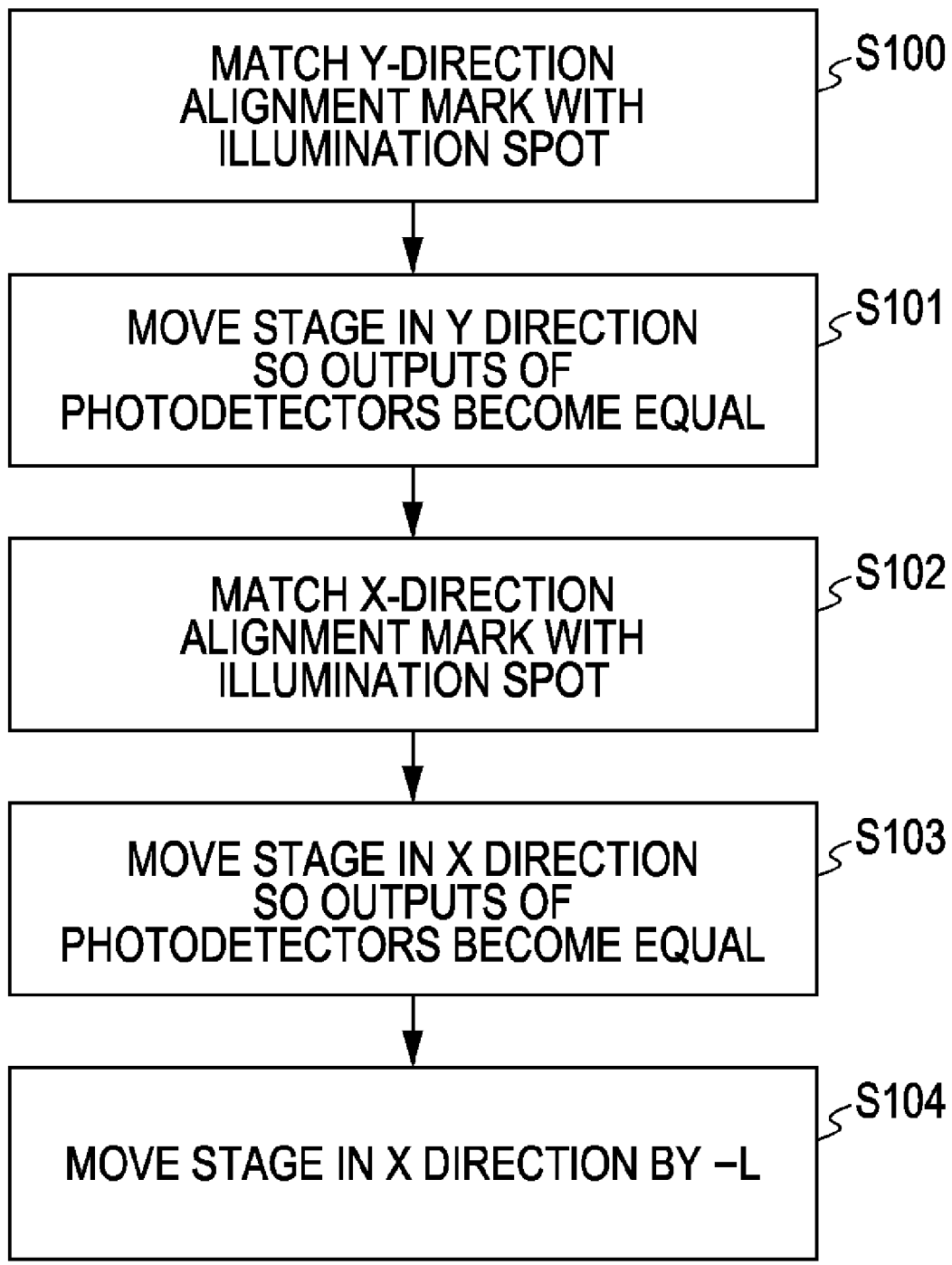
FIG. 7 is a flowchart of an alignment operation.

Next, an alignment method of matching the position of the wavefront measurement pattern 20 with the position of the illumination spot 23 will be described with reference to FIG. 7.

First, in step S100, the stage 12 holding the wavefront measurement mask 11 is moved so that the position of the Y-direction alignment mark 33 approximately matches the position of the illumination spot 23. This movement is intended to apply the illumination spot 23 somewhere on the Y-direction alignment mark 33, and therefore the illumination spot 23 only needs to be positioned roughly.

Subsequently, the light quantities of the diffracted beams from the diffraction gratings 33a and 33b of the Y-direction alignment mark 33 are detected with the photodetectors 35a and 35b, respectively, and data on the detection is output to a control unit 36 that controls the position of the stage 12. In response to this, in step S101, the control unit 36 causes the stage 12 to move in the Y-direction in accordance with the results of the detection by the photodetectors 35a and 35b in such a manner that the respective light quantities detected by the photodetectors 35a and 35b, i.e., the outputs of the photodetectors 35a and 35b, become equal. When the outputs of the photodetectors 35a and 35b become equal, the Y-coordinate of the center of the wavefront measurement pattern 20 and the Y-coordinate of the center of the illumination spot 23 coincide with each other.

Then, in step S102, the stage 12 is moved in the X direction so that the position of the X-direction alignment mark 32 approximately matches the position of the illumination spot 23. Subsequently, the light quantities of the diffracted beams from the diffraction gratings 32a and 32b of the X-direction alignment mark 32 are detected with the photodetectors 35a and 35b respectively, and data on the detection is output to the control unit 36. In this case, the light quantity of a diffracted beam from the diffraction grating 32a is detected with the photodetector 35a, and the light quantity of a diffracted beam from the diffraction grating 32b is detected with the photodetector 35b. Then, in step S103, the control unit 36 causes the stage 12 to move in the X-direction in accordance with the results of the detection by the photodetectors 35a and 35b in such a manner that the respective light quantities detected by the photodetectors 35a and 35b become equal, as in step S101.

When the outputs of the photodetectors 35a and 35b become equal, the center of the wavefront measurement pattern 20 is positioned at the distance L from the center of the illumination spot 23 in the X-direction. Therefore, in step S104, the control unit 36 controls the stage 12 to move in the X-direction by a length –L. Consequently, the center position of the wavefront measurement pattern 20 and the center position of the illumination spot 23 match each other.

In this manner, the position of the wavefront measurement pattern 20 and the position of the illumination spot 23 can be made to accurately match each other in both the X and Y directions. Accordingly, the image pickup unit 18 can obtain an interference fringe image of high light intensity and high contrast. Then, the interference fringe image is subjected to analysis (arithmetic processings) by the control unit 19. Thus, accurate information on the wavefront aberration of the to-be-tested optical system 10 can be obtained.

In the first embodiment, the position of the wavefront measurement pattern 20 is made to match with the position of the illumination spot 23 that is fixed, by moving the stage 12. Alternatively, the illumination spot 23 may be moved by the illumination optical system 14 so as to match the position of the wavefront measurement pattern 20. Also in that case, the same advantageous effect is naturally obtained.

The positions of the X- and Y-direction alignment marks 32 and 33 are not limited to those described above, and may be set at any positions as long as the relative positions of the boundary between the pairs of diffraction gratings and the wavefront measurement pattern 20 are known. For example, when the boundary between the diffraction gratings 33a and 33b of the Y-direction alignment mark 33 is set at a predetermined distance from the center of the wavefront measurement pattern 20 in the Y direction, the boundary between the diffraction gratings 32a and 32b of the X-direction alignment mark 32 can be set at a position matching the center of the wavefront measurement pattern 20 in the X direction.

In the first embodiment, the outputs of the two photodetectors 35a and 35b become equal when the center of the illumination spot 23 is positioned at the boundary between each pair of diffraction gratings. Alternatively, the outputs may not necessarily become equal. For example, in a case where photodetectors of different sensitivities are used, such a difference in sensitivity only needs to be taken into consideration, that is, the ratio of light quantities detected by the respective photodetectors when the equal areas of the two diffraction gratings are illuminated only needs to be stored and used for analysis.

Although the first embodiment concerns the case of a wavefront measurement pattern including a plurality of regularly arranged reflective pinholes, the wavefront measurement pattern is not limited thereto.

According to the first embodiment, the wavefront aberration of a to-be-tested optical system can be measured with high accuracy.

A second embodiment of the present invention will now be described with reference to FIG. 8. The second embodiment differs from the first embodiment in the alignment mark and, accompanying the difference in the alignment mark, the number of photodetectors. Descriptions of elements that are the same as or alternatively similar to those in the first embodiment will be omitted.

Figure 8:
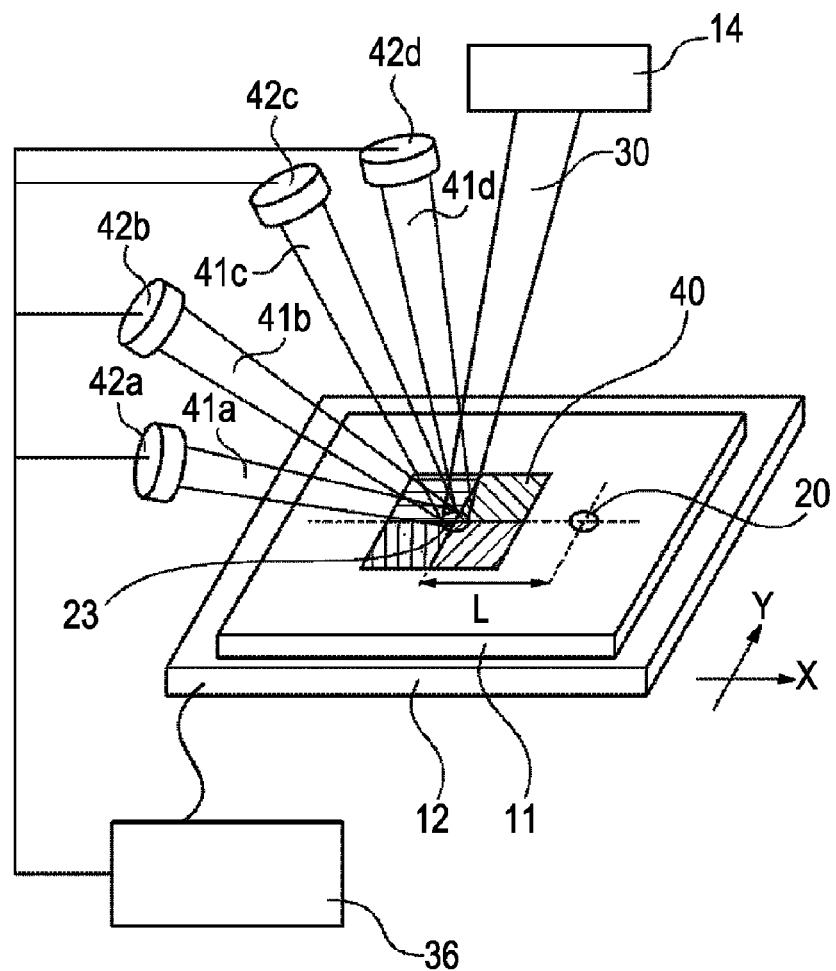
FIG. 8 shows a wavefront measurement mask and elements provided therearound in a second embodiment of the present invention.

FIG. 8 shows the wavefront measurement mask 11 and elements provided therearound. The wavefront measurement mask 11 has the wavefront measurement pattern 20 and an alignment mark 40 formed thereon. The alignment mark 40 has such a configuration that the X- and Y-direction alignment marks 32 and 33 in the first embodiment are integrated together.

Figure 9:
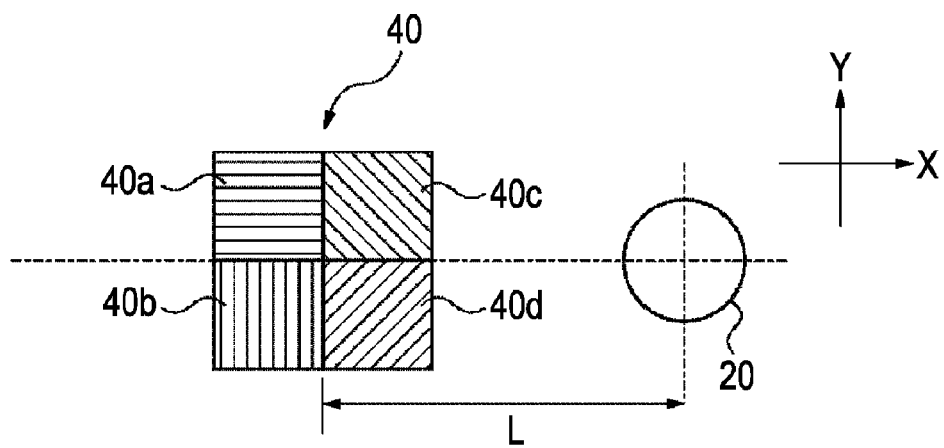
FIG. 9 shows an alignment mark and the wavefront measurement pattern in the second embodiment.

The alignment mark 40 includes diffraction gratings ruled with lines as shown in oblique lines in FIG. 9. The alignment mark 40 includes four diffraction gratings 40a, 40b, 40c, and 40d adjoining each other, and the orientations of the lines ruled therein are different from each other. The lines of the diffraction grating 40a extend in the X-axis direction, and the lines of the diffraction grating 40b extend in the Y-axis direction. The lines of the diffraction grating 40c extend from upper left to lower right, and the lines of the diffraction grating 40d extend from upper right to lower left.

The Y-coordinate of the boundary between the diffraction gratings 40a and 40b (40c and 40d) of the alignment mark 40 coincides with the Y-coordinate of the center of the wavefront measurement pattern 20. The boundary between the diffraction gratings 40a and 40c (40b and 40d) lies at a predetermined distance L from the X-coordinate of the center of the wavefront measurement pattern 20.

The illuminating light 30 applied to the diffraction gratings 40a to 40d of the alignment mark 40 is diffracted into different directions according to the orientation of the lines. To detect the light quantities of first-order diffracted beams 41a, 41b, 41c, and 41d from the respective diffraction gratings 40a, 40b, 40c, and 40d, four photodetectors 42a, 42b, 42c, and 42d are provided. Specifically, the first-order diffracted beam 41a from the diffraction grating 40a is detected by the photodetector 42a, the first-order diffracted beam 41b from the diffraction grating 40b is detected by the photodetector 42b, the first-order diffracted beam 41c from the diffraction grating 40c is detected by the photodetector 42c, and the first-order diffracted beam 41d from the diffraction grating 40d is detected by the photodetector 42d.

Next, an alignment method of matching the position of the wavefront measurement pattern 20 with the position of the illumination spot 23 in the second embodiment will be described.

First, the stage 12 holding the wavefront measurement mask 11 is moved so that the position of the alignment mark 40 approximately matches the position of the illumination spot 23. Subsequently, the light quantities of the diffracted beams 41a to 41d from the diffraction gratings 40a to 40d of the alignment mark 40 are detected with the photodetectors 42a to 42d respectively, and data on the detection is output to the control unit 36 that controls the position of the stage 12.

Then, the stage 12 is moved in the X- and Y-directions in such a manner that all of the light quantities (outputs) detected by the photodetectors 42a to 42d become equal. When the outputs of all of the photodetectors 42a to 42d become equal, the Y-coordinate of the center of the wavefront measurement pattern 20 and the Y-coordinate of the center of the illumination spot 23 coincide with each other, and the center of the wavefront measurement pattern 20 is positioned at a distance L from the center of the illumination spot 23 in the X-direction. Therefore, by moving the stage 12 in the X direction by a length −L, the center of the wavefront measurement pattern 20 and the center of the illumination spot 23 match each other.

According to the second embodiment, X-direction alignment and Y-direction alignment can be performed simultaneously during measurement using the photodetectors. Therefore, the time required for performing alignment (measurement of the wavefront aberration) can be reduced more than in the first embodiment.

A third embodiment of the present invention will now be described with reference to FIG. 10. FIG. 10 is a schematic diagram of an exemplary embodiment of a projection exposure apparatus 100 according to the present invention. In the projection exposure apparatus 100, EUV light is employed as exposure light. However, the exposure light of the projection exposure apparatus 100 may not necessarily be EUV light. The projection exposure apparatus 100 includes the EUV light source 13, the illumination optical system 14, a reticle stage 142 on which a reticle (mask) 140, as an original, is mounted, a projection optical system 150, which is to be tested, and a wafer stage 162 on which a wafer 160, as a substrate, is mounted. The projection exposure apparatus 100 also includes the aperture stop 15, the aperture-stop-moving mechanism 16, the diffraction grating 17, the image pickup unit 18, and a switching mechanism 132.

In the projection exposure apparatus 100, the reticle 140 is illuminated with EUV light (a wavelength of 13.5 nm), as exposure light, through the illumination optical system 14, and an image of a circuit pattern formed on the reticle 140 is transferred by exposure through the projection optical system 150 to the wafer 160.

Since EUV light has low transmittance in the atmosphere, elements including the illumination optical system 14, the projection optical system 150, and so forth are housed in a vacuum housing 102. The EUV light source 13, which oscillates EUV light, is of a discharge-produced-plasma type in which plasma is produced by creating a discharge in Xe gas or Sn steam, for example, whereby EUV light is generated. Alternatively, the EUV light source 13 may be of a laser-produced-plasma type in which a convergent beam of high-power pulsed laser is applied to Xe or Sn, whereby plasma is produced.

The illumination optical system 14 illuminates the reticle 140 with the EUV light propagated therein. Specifically, the illumination optical system 14 receives the EUV light from the EUV light source 13 and uniformly illuminates the reticle 140 with a predetermined numerical aperture (NA). In the third embodiment, when exposure of the wafer 160 is performed, the aperture stop 15 is retracted from the optical path by driving the aperture-stop-moving mechanism 16.

The reticle 140, which is a reflective reticle, has a circuit pattern formed thereon. The circuit pattern is to be transferred. The reticle 140 is supported and moved by the reticle stage 142. Light diffracted by the reticle 140 is reflected by the projection optical system 150 and is projected onto the wafer 160. The reticle 140 and the wafer 160 are arranged so as to be optically conjugate with each other. The wafer 160 is supported and moved by the wafer stage 162.

When the wavefront of the projection optical system 150 is measured, the wavefront measurement mask 11 described in the first and second embodiments is mounted in place of the reticle 140. The reticle stage 142 may also serve as the stage 12 of the first embodiment. The wafer stage 162 can be placed into or retracted from the exposure area by the switching mechanism 132 so that the image pickup unit 18 and the diffraction grating 17 together can switch positions with the wafer stage 162. Alternatively, the image pickup unit 18 and the diffraction grating 17 may be provided on the wafer stage 162. When the wavefront (wavefront aberration) of the projection optical system 150 is measured, the aperture-stop-moving mechanism 16 is driven so that the aperture stop 15 is placed into the optical path.

By aligning the illumination spot and the wavefront measurement pattern in either of the manners described in the first and second embodiments by using a projection exposure apparatus including a wavefront aberration measuring device, the wavefront aberration of a projection optical system included in the projection exposure apparatus can be measured.

The projection optical system employing EUV light is extremely sensitive to changes in position accuracy and deformation due to heat. Moreover, if impurities adhere to any multilayered mirrors of the projection optical system and undergo a chemical change, a phase change due to contamination may occur, for example. To avoid this, the wavefront aberration of the projection optical system is measured between exposure operations, and, in accordance with the measurement results, the positions of the mirrors are adjusted.

According to the third embodiment, the wavefront of the projection optical system can be measured with high accuracy at any time after the exposure apparatus is operated for a certain period.

Next, a method of manufacturing a device (a semiconductor integrated-circuit (IC) device, a liquid crystal display device, and the like) by using the exposure apparatus described above will be described. A device is manufactured through a step of exposing a substrate (a wafer, a glass plate, or the like), to which a photoresist is applied, to light by using the exposure apparatus, a step of developing the substrate (the photoresist), and other known steps (etching, resist stripping, dicing, bonding, packaging, and so forth). According to this device manufacturing method, a device having higher quality than known ones can be manufactured.

Many apparently widely different embodiments of the present invention can be made without departing from the spirit and scope thereof. It is to be understood that the invention is not limited to the specific embodiments thereof except as defined in the claims.

This application claims the benefit of Japanese Patent Application No. 2008-043064 filed on Feb. 25, 2008, which is hereby incorporated by reference herein in its entirety.

What is claimed is:

1. A mask used in a wavefront aberration measuring device in which wavefront aberration of a to-be-tested optical system is measured, the mask comprising:

a pattern including a pinhole producing a spherical wave,
a plurality of diffraction gratings adjoining each other and each ruled with lines oriented in a direction different from the other diffraction grating,
wherein the mask is placed in an object plane of the to-be-tested optical system
wherein the wavefront aberration is measured based on interference fringes produced by applying light from a light source to the pattern so as to cause the light emitted from the pattern to be split after being transmitted through the to-be-tested optical system, wherein the plurality of diffraction gratings include:
two diffraction gratings adjoining in a first direction and each ruled with lines oriented in a direction different from those of the other diffraction grating; and
two diffraction gratings adjoining in a second direction perpendicular to the first direction and each ruled with lines oriented in a direction different from those of the other diffraction grating, wherein the position of a boundary between the two diffraction gratings adjoining in the first direction matches a position of a center of the pattern in the first direction, and wherein a boundary between the two diffraction gratings adjoining in the second direction lies at a predetermined distance from the center of the pattern in the second direction.

2. A mask used in a wavefront aberration measuring device in which wavefront aberration of a to-be-tested optical system is measured, the mask comprising:

a pattern including a pinhole producing a spherical wave,
a plurality of diffraction gratings adjoining each other and each ruled with lines oriented in a direction different from the other diffraction grating,
wherein the mask is placed in an object plane of the to-be-tested optical system,
wherein the wavefront aberration is measured based on interference fringes produced by applying light from a light source to the pattern so as to cause the light emitted from the pattern to be split after being transmitted through the to-be-tested optical system,
wherein the plurality of diffraction gratings include four diffraction gratings each ruled with lines oriented in a direction different from those of the other diffraction gratings, and
wherein each of the four diffraction gratings adjoins two of the others.

3. A wavefront aberration measuring device comprising:
the mask according to claim 1 or 2;
an illumination optical system configured to illuminate an area of the mask with light emitted from a light source;
a light splitter configured to split the light emitted from the pattern and transmitted through the to-be-tested optical system;
an image pickup unit configured to take an image of interference fringes produced by the light split by the light splitter, the image of interference fringes being used in measuring wavefront aberration of the to-be-tested optical system;
a detector configured to detect respective light quantities of respective diffracted beams of the light from respective ones of the diffraction gratings illuminated with the light; and
a control unit configured to control alignment of the pattern and illuminating light for illuminating the pattern in accordance with a result of detection performed by the detector.

* * * * *